US011014826B2

(12) United States Patent
Kojima et al.

(10) Patent No.: US 11,014,826 B2
(45) Date of Patent: *May 25, 2021

(54) FERRITE PARTICLES, RESIN COMPOSITION AND RESIN FILM

(71) Applicant: POWDERTECH CO., LTD., Chiba (JP)

(72) Inventors: Takashi Kojima, Chiba (JP); Kazutaka Ishii, Chiba (JP); Takao Sugiura, Chiba (JP); Tetsuya Igarashi, Chiba (JP); Koji Aga, Chiba (JP)

(73) Assignee: POWDERTECH CO., LTD., Chiba (JP)

( * ) Notice: Subject to any disclaimer, the term of this patent is extended or adjusted under 35 U.S.C. 154(b) by 0 days.

This patent is subject to a terminal disclaimer.

(21) Appl. No.: 16/082,102

(22) PCT Filed: Feb. 22, 2017

(86) PCT No.: PCT/JP2017/006527
§ 371 (c)(1),
(2) Date: Sep. 4, 2018

(87) PCT Pub. No.: WO2017/169316
PCT Pub. Date: Oct. 5, 2017

(65) Prior Publication Data
US 2019/0161362 A1    May 30, 2019

(30) Foreign Application Priority Data

Mar. 31, 2016  (JP) .............................. JP2016-070280

(51) Int. Cl.
*H01F 1/36*  (2006.01)
*H01F 1/37*  (2006.01)
(Continued)

(52) U.S. Cl.
CPC ......... *C01G 49/0072* (2013.01); *C01G 49/00* (2013.01); *C08K 3/22* (2013.01);
(Continued)

(58) Field of Classification Search
CPC ... H01F 1/375; H01F 1/34; H01F 1/36; H01F 1/37; C01G 49/0072; C30B 29/22
See application file for complete search history.

(56) References Cited

U.S. PATENT DOCUMENTS 6,383,407 B2   5/2002  Ogata et al.
6,793,842 B2   9/2004  Akimoto et al.
(Continued)

FOREIGN PATENT DOCUMENTS

CN   1335283 A    2/2002
CN   101460404 A  6/2009
(Continued)

OTHER PUBLICATIONS

Machine translation of JP-2006335614-A, 18 pages (Year: 2006).*
(Continued)

*Primary Examiner* — Matthew E. Hoban
*Assistant Examiner* — Lynne Edmondson
(74) *Attorney, Agent, or Firm* — Greenblum & Bernstein, P.L.C.

(57) ABSTRACT

An object of the present invention is to provide ferrite particles having a high saturation magnetisation, and being excellent in the dispersibility in a resin, a solvent or a resin composition, a resin composition including the ferrite particles, and a resin film composed of the resin composition. The ferrite particles are a single crystalline body having an average particle size of 1 to 2000 nm, and Mn-based ferrite particles having a spherical shape, and have a saturation magnetisation of 45 to 95 Am²/kg. The resin composition
(Continued)

includes the ferrite particles as a filler. The resin film is composed of the resin composition.

5 Claims, 1 Drawing Sheet

(51) Int. Cl.
*H01F 1/375* (2006.01)
*C01G 49/00* (2006.01)
*C08K 3/22* (2006.01)
*C08L 101/00* (2006.01)
*C30B 29/22* (2006.01)
*C08K 7/18* (2006.01)
*H05K 1/02* (2006.01)
*H05K 1/03* (2006.01)

(52) U.S. Cl.
CPC .............. *C08K 7/18* (2013.01); *C08L 101/00* (2013.01); *C30B 29/22* (2013.01); *H01F 1/36* (2013.01); *H01F 1/37* (2013.01); *H01F 1/375* (2013.01); *C01P 2002/01* (2013.01); *C01P 2002/70* (2013.01); *C01P 2004/04* (2013.01); *C01P 2004/32* (2013.01); *C01P 2004/61* (2013.01); *C01P 2004/62* (2013.01); *C01P 2004/64* (2013.01); *C01P 2006/12* (2013.01); *C01P 2006/42* (2013.01); *C08K 2003/2265* (2013.01); *C08K 2201/005* (2013.01); *C08K 2201/006* (2013.01); *C08K 2201/01* (2013.01); *C08K 2201/011* (2013.01); *H05K 1/028* (2013.01); *H05K 1/0373* (2013.01); *H05K 2201/083* (2013.01)

(56) References Cited

U.S. PATENT DOCUMENTS

| | | | |
|---|---|---|---|
| 8,465,898 B2 | 6/2013 | Iwata et al. | |
| 8,535,867 B2 | 9/2013 | Suwa et al. | |
| 2002/0017628 A1* | 2/2002 | Akimoto | H01F 1/36 252/62.56 |
| 2005/0042532 A1* | 2/2005 | Iida | G03G 9/09 430/45.1 |
| 2008/0206664 A1 | 8/2008 | Shinmura et al. | |
| 2009/0053512 A1* | 2/2009 | Pyun | G11B 5/712 428/336 |
| 2010/0193972 A1 | 8/2010 | Yamamoto et al. | |
| 2011/0244389 A1 | 10/2011 | Kojima et al. | |
| 2016/0266510 A1 | 9/2016 | Sasaki et al. | |
| 2017/0301443 A1 | 10/2017 | Aga et al. | |

FOREIGN PATENT DOCUMENTS

| | | | | |
|---|---|---|---|---|
| EP | 1 170 757 A2 | | 9/2002 | |
| JP | S61291421 A | * | 12/1986 | ............ H01L 24/32 |
| JP | H11-021129 A | | 1/1999 | |
| JP | H11-024305 A | | 1/1999 | |
| JP | H11-025447 A | | 1/1999 | |
| JP | 2003-238163 A | | 8/2003 | |
| JP | 2006-335614 A | | 12/2006 | |
| JP | 2006335614 A | * | 12/2006 | |
| JP | 2008-216339 A | | 9/2008 | |
| JP | 2010-184840 A | | 8/2010 | |
| JP | 2014-074133 A | | 4/2014 | |
| JP | 2015-101509 A | | 6/2015 | |
| WO | WO 2004/065306 A1 | | 8/2004 | |

OTHER PUBLICATIONS

Tang et al., "Mn-doped ZnFe2O4 nanoparticles with enhanced performances as anode materials for lithium ion batteries", 2014, Materials Research Bulletin, 57, pp. 127-134. (Year: 2014).*
Machine translation of JP-S61291421-A, 11 pages. (Year: 1986).*
Office Action issued in Korea family member Patent Appl. No. 10-2018-7024779, dated Feb. 18, 2019, along with an English translation thereof.
Office Action issued in Canadian family member Patent Appl. No. 3017094, dated Jan. 4, 2019.
U.S. Appl. No. 16/084,420 to Takao Sugiura et al., filed Sep. 12, 2018.
U.S. Appl. No. 16/084,466 to Takao Sugiura et al., filed Sep. 12, 2018.
International Search Report issued in International Bureau of WIPO Patent Application No. PCT/JP2017/006527, dated May 23, 2017.
Written Opinion of the International Searching Authority issued in International Bureau of WIPO Patent Application No. PCT/JP2017/006527, dated May 23, 2017, together with an English translation.
International Preliminary Report on Patentability issued in International Bureau of WIPO Patent Application No. PCT/JP2017/006527, dated Oct. 2, 2018.
Office Action for TW App. No. 10920511350 dated May 29, 2020 (w/ translation).

* cited by examiner

[Fig. 1]
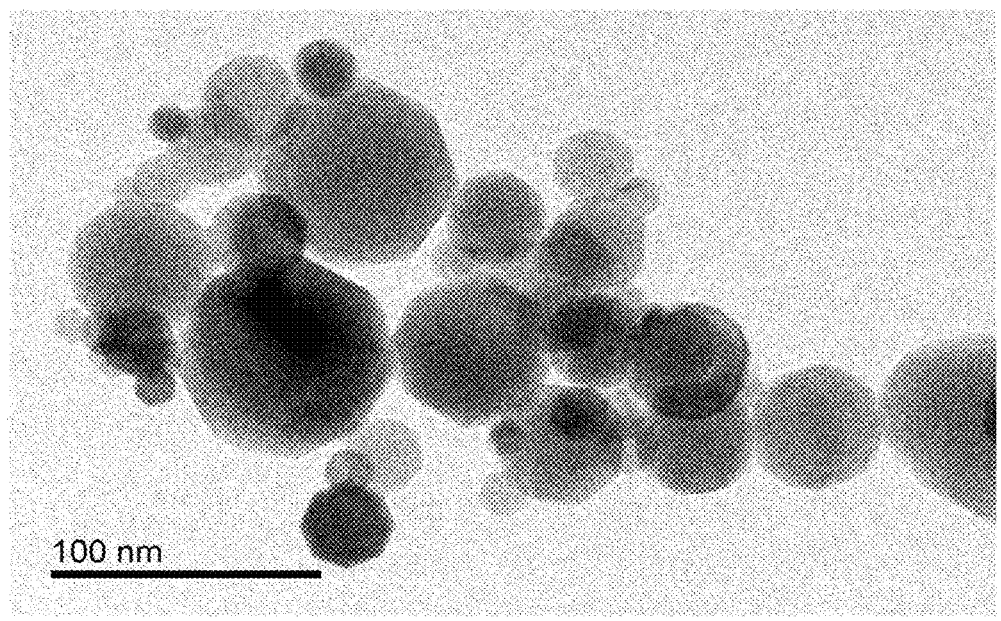
[Fig. 2]
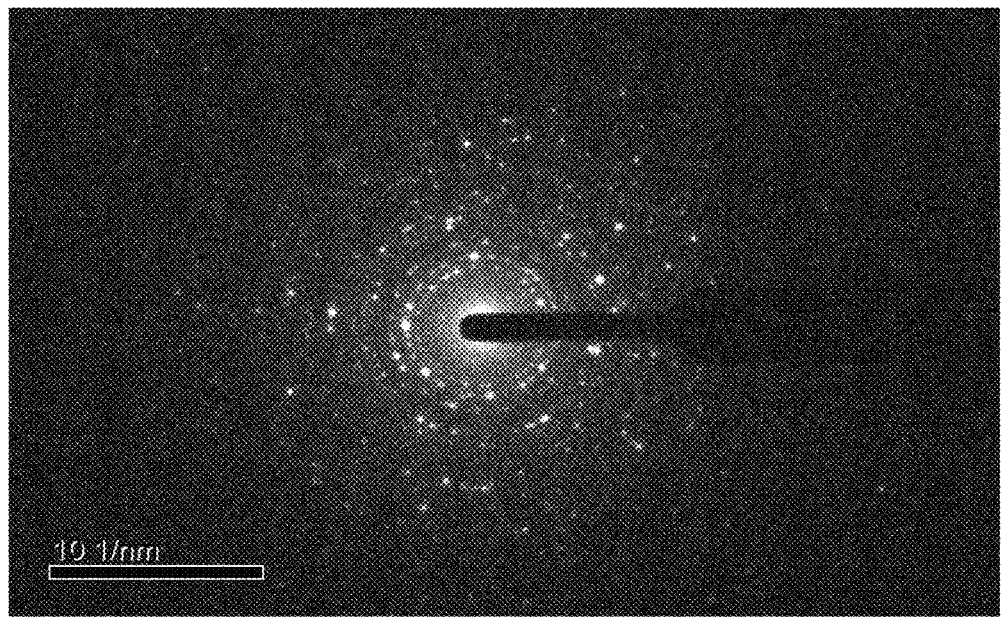

FERRITE PARTICLES, RESIN COMPOSITION AND RESIN FILM

TECHNICAL FIELD

The present invention relates to ferrite particles, a resin composition including the ferrite particles, and a resin film composed of the resin composition.

BACKGROUND ART

As flexible printed wiring boards used for wiring to electronic devices, cables and the like, there have been proposed resin films including fillers such as silicon oxide, titanium oxide, and aluminum oxide each having an average particle size of 1 to 10 μm (see, for example, Patent Literature 1).

Such a resin film is formed, for example, as follows: a filler is dispersed in a resin composition including a resin and an aqueous solvent or an organic solvent-based solvent, then the resin composition including the filler is applied to a substrate, subsequently the solvent is evaporated to harden the resin. Then, a metal wiring is formed by laminating a metal layer such as a copper layer on the resin film. In this case, the resin film which function as a base is necessary when the metal layer is laminated. On the other hand, after the lamination of the metal layer, it is necessary to remove the resin film which is now unnecessary depending on the shape of the metal wiring.

Accordingly, in order to simply and efficiently perform the removal of the resin film, it is conceived that ferrite particles are used as a filler in place of silicon oxide or the like, the resin film is adsorbed to remove by applying a magnetic field to the resin film.

It is conceivable to use as the ferrite particles, for example, Mn—Mg ferrite particles disclosed in Patent Literature 2, having an average particle size of 20 to 50 μm and a magnetisation (saturation magnetisation) of approximately 60 Am$^2$/kg.

CITATION LIST

Patent Literature

[Patent Literature 1] Japanese Patent Laid-Open No. 2014-074133
[Patent Literature 2] Japanese Patent Laid-Open No. 2008-216339

SUMMARY OF INVENTION

Technical Problem

However, when the ferrite particles disclosed in Patent Literature 2 are used in a resin film, it is sometimes difficult to disperse the ferrite particles in a resin, a solvent or a resin composition, or asperities are liable to occur due to the ferrite particles on the surface of the film.

The technical problem of the present invention aims at providing ferrite particles excellent in the dispersibility in a resin, a solvent or a resin composition, a resin composition including the ferrite particles, and a resin film composed of the resin composition.

Solution to Problem

The present inventors made a diligent study in order to solve such a technical problem as described above, and have reached the present invention by discovering that ferrite particles composed of a single crystalline body having a particle size falling within a specific range, having a spherical shape, and having a specific ferrite composition have the properties satisfying the above-described object.

Specifically, the ferrite particles according to the present invention are a single crystalline body having an average particle size of 1 to 2000 nm, Mn-based ferrite particles having a spherical particle shape, and have a saturation magnetisation of 45 to 95 Am$^2$/kg.

The ferrite particles according to the present invention is composed of Mn and Fe as the metal components, and preferably contains Mn in a content of 1 to 23% by weight and Fe in a content of 58 to 65% by weight.

The ferrite particles according to the present invention preferably have a residual magnetisation of 0 to 12 Am$^2$/kg.

The ferrite particles according to the present invention preferably have a BET specific surface area of 1 to 30 m$^2$/g.

The resin composition according to the present invention is characterized by including the ferrite particles as a filler.

The resin film according to the present invention is characterized by being composed of the resin composition.

Advantageous Effects of Invention

The ferrite particles according to the present invention are Mn-based ferrite particles composed of a single crystalline body, and accordingly can obtain a high saturation magnetisation of 45 to 95 Am$^2$/kg, and can lower the residual magnetisation. The ferrite particles according to the present invention has a spherical particle shape having an average particle size of 1 to 2000 nm, and can reduce the mutual aggregation of the particles through the low residual magnetisation, and accordingly can obtain an excellent dispersibility in a resin, a solvent or a resin composition. Consequently, the ferrite particles according to the present invention can prevent the aggregation of the ferrite particles when the ferrite particles are suitably used in a resin film including the ferrite particles as a filler, and thus a smooth surface of the resin film can be obtained. By applying a magnetic field to the resin film, the resin film can be adsorbed.

BRIEF DESCRIPTION OF DRAWINGS

FIG. 1 is a transmission electron micrograph of the ferrite particles of Example 1.
FIG. 2 is an electron diffraction pattern of the ferrite particles of Example 1.

DESCRIPTION OF EMBODIMENTS

Hereinafter, the embodiments of the present invention are described.

<Ferrite Particles According to Present Invention>

The ferrite particles according to the present invention are composed of a single crystalline body having a particle size falling within a specific range, have a spherical shape, and have a specific ferrite composition, and accordingly, can obtain a high saturation magnetisation, and can obtain an excellent dispersibility in a resin, a solvent, and a resin composition. The resin composition as referred to herein may be a substance composed of one or more resins and a solvent, or alternatively may be a substance composed of one or more resins.

The spherical shape as referred to herein means a shape having an average degree of sphericity of 1 to 1.2, preferably 1 to 1.1, and further preferably as close to 1 as possible.

When the average degree of sphericity exceeds 1.2, the sphericity of the ferrite particles is impaired.

(Average Degree of Sphericity)

The degree of sphericity can be determined as follows. First, ferrite particles are photographed at a magnification of 200,000 by using an FE-SEM (SU-8020, Hitachi High-Technologies Corp.) as a scanning electron microscope. Photographing was carried out in a field of view capable of counting 100 or more ferrite particles. The taken SEM image is read with a scanner, and an image analysis is performed by using an image analysis software (Image-Pro PLUS, Media Cybernetics Corp.). The circumscribed circle diameter and the inscribed circle diameter of each of the particles are determined by manual measurement, and the ratio therebetween (circumscribed circle diameter/inscribed circle diameter) is taken as the degree of sphericity. When these two diameters are the same, namely, a perfect sphere is involved, this ratio is 1. In the present embodiment, the average value of the degrees of sphericity of 100 of the ferrite particles was taken as the average degree of sphericity.

(Average Particle Size)

The average particle size of the ferrite particles according to the present invention is 1 to 2000 nm. In the case where the average particle size is less than 1 nm, even when the surface treatment is applied, the ferrite particles aggregate, and an excellent dispersibility in a resin, a solvent or a resin composition cannot be obtained. On the other hand, in the case where the average particle size exceeds 2000 nm, the dispersibility can be secured, but when a molded article containing the ferrite particles is formed, asperities are sometimes caused on the surface of the molded article due to the presence of the ferrite particles. Moreover, when the molded article is a flexible printed wiring board used in the wiring to electronic devices, cables and the like, the metal wiring formed on the surface of the wiring board is liable to be damaged by the asperities. The average particle size of the ferrite particles is preferably 1 to 800 nm, and further preferably 1 to 300 nm.

For the determination of the average particle size of the ferrite particles, an image is photographed at a magnification of 200,000 in the same manner as in the case of the average degree of sphericity, the horizontal Feret's diameters of the ferrite particles are measured by manual measurement on the basis of the obtained image, and the average value of the horizontal Feret's diameters can be taken as the average particle size.

(Crystal Form)

The ferrite particles according to the present invention are morphologically a single crystalline body. In the case of ferrite particles being a polycrystalline substance, in the course of the crystal growth based on firing, fine pores are generated in the crystal grain boundary in the fine structure in one particle. Consequently, when the ferrite particles are mixed in a resin, a solvent or a resin composition, the resin composition or the like penetrates into the aforementioned pores, and accordingly sometimes it requires a long time for the ferrite particles, the resin composition and the like to be uniformly dispersed. In addition, depending on the conditions, a more than necessary amount of a resin, a solvent or a resin composition is required, so as to be disadvantageous from the viewpoint of cost. In contrast, in the case of the ferrite particles being a single crystalline body, such a disadvantage is eliminated.

(Composition)

The ferrite particles according to the present invention are Mn-based ferrite particles. The metal component of the ferrite particles is composed of Mn and Fe, and the ferrite particles preferably contain Mn in a content of 1 to 23% by weight and Fe in a content of 58 to 65% by weight. In this case, the ferrite particles more preferably contain no metal components other than Fe and Mn (note that, except for inevitable impurities). The ferrite particles of the present invention are Mn-based ferrite particles, and accordingly can obtain a high saturation magnetisation and a low residual magnetisation in a compatible manner.

When the content of Mn is less than 1% by weight, the residual magnetisation of the ferrite particles is large, and the ferrite particles sometimes tend to mutually aggregate. In this case, it is difficult to uniformly disperse the aforementioned ferrite particles in a resin, a solvent or a resin composition. On the other hand, when the content of Mn exceeds 23% by weight, sometimes the desired saturation magnetisation cannot be obtained in the ferrite particles.

When the content of Fe is less than 58% by weight, sometimes the desired saturation magnetisation cannot be obtained in the ferrite particles. On the other hand, when the content of Fe exceeds 65% by weight, the residual magnetisation of the ferrite particles is large, and sometimes the ferrite particles tend to mutually aggregate. In this case, it is difficult to uniformly disperse the aforementioned ferrite particles in a resin, a solvent or a resin composition.

The contents of Fe and Mn can be measured as follows. A ferrite-containing solution is prepared as follows: 0.2 g of the ferrite particles are weighed out, and placed in an acid aqueous solution prepared by adding 20 ml of 1N hydrochloric acid and 20 ml of 1N nitric acid to 60 ml of pure water; then the acid aqueous solution is heated to completely dissolve the ferrite particles to prepare a ferrite-containing solution. Subsequently, the contents of Fe and Mn in the aforementioned ferrite-containing solution are measured by using an ICP analyzer (ICPS-1000IV, manufactured by Shimadzu Corporation).

(BET Specific Surface Area)

The ferrite particles according to the present invention preferably have a BET specific surface area of 1 to 30 $m^2/g$. In the case where the BET specific surface area is less than 1 $m^2/g$, when a resin composition containing the ferrite particles is formed, the affinity between the particle surface and the resin composition is insufficient, and the resin composition present on the surface of the particles is sometimes locally piled up; when a molded article is formed by using this resin composition, asperities sometimes occur on the surface of the molded article. On the other hand, in the case of ferrite particles composed of Mn and Fe, particles having a flat and smooth surface state are frequently formed, and the BET specific surface area of the ferrite particles does not exceed 30 $m^2/g$. The BET specific surface area of the ferrite particles is preferably 5 to 20 $m^2/g$.

(Saturated Magnetisation)

The ferrite particles according to the present invention have a saturation magnetisation of 45 to 95 $Am^2/kg$. By setting the saturation magnetisation within the aforementioned range, desired performances can be obtained. When the saturation magnetisation is less than 45 $Am^2/kg$, the desired performances cannot be obtained. On the other hand, in the ferrite particles composed of Mn and Fe, it is difficult to attain a saturation magnetisation exceeding 95 $Am^2/kg$.

(Residual Magnetisation)

The ferrite particles according to the present invention preferably has a residual magnetisation of 0 to 12 $Am^2/kg$.

By setting the residual magnetisation within the aforementioned range, the dispersibility in a resin, a solvent or a resin composition can be more reliably obtained. When the residual magnetisation is larger than 12 $Am^2/kg$, sometimes the ferrite particles tend to be mutually aggregated, and in that case, sometimes it is difficult to uniformly disperse the aforementioned ferrite particles in a resin, a solvent or a resin composition.

<Method for Producing Ferrite Particle>

Next, a method for producing the aforementioned ferrite particles is described.

The ferrite particles can be produced as follows: a ferrite raw material including Mn and Fe is thermally sprayed in the air to ferriterize, subsequently the ferrite is rapidly cooled to be solidified, then only particles falling within a predetermined particle size range are collected.

The method for preparing the ferrite raw material is not particularly limited; heretofore known methods can be adopted, and a dry type method may be used, or a wet type method may also be used.

An example of the method for preparing the ferrite raw material (granulated product) is such that an Fe raw material and a Mn raw material are weighed out in appropriate amounts so as to give a desired ferrite composition, then water is added to the weighed out raw materials, and the resulting mixture is pulverized to prepare a slurry. The prepared pulverized slurry is granulated with a spray dryer, and classified to prepare a granulated product having a predetermined particle size. The particle size of the granulated product is preferably approximately 0.5 to 10 μm in consideration of the particle sizes of the ferrite particles to be obtained. In addition, another example is such that ferrite raw materials regulated in compositions are mixed, the resulting mixture is dry-pulverized to pulverize and disperse the individual raw materials, and the resulting mixture is granulated with a granulator and classified to prepare a granulated product having a predetermined particle size.

The granulated product thus prepared is thermally sprayed in the air to be ferritized. For thermal spray, as a combustion flame of a combustible gas, a mixed gas composed of a combustion gas and oxygen can be used, and the volume ratio between the combustion gas and oxygen is 1:3.5 to 6.0. When the ratio of oxygen to the combustion gas in the combustion flame of a combustible gas is less than 3.5, the fusion is sometimes insufficient, and when the ratio of oxygen to the combustion gas exceeds 6.0, the ferritization is difficult. For example, the mixed gas can be used in a ratio of the oxygen flow rate of oxygen 35 to 60 $Nm^3/hr$ to the combustion gas flow rate of 10 $Nm^3/hr$.

As the combustion gas used in the thermal spray, gases such as propane gas, propylene gas, and acetylene gas can be used; in particular, propane gas can be suitably used. In addition, for conveying the granulated product during the combustion of the combustible gas, nitrogen, oxygen, or air can be used as the granulated product conveying gas. The linear velocity of the conveyed granulated product is preferably 20 to 60 m/sec. The thermal spray is performed at a temperature of preferably 1000 to 3500° C. and more preferably 2000 to 3500° C.

Subsequently, the ferrite particles ferritized by thermal spray are rapidly cooled and solidified by conveying the ferrite particles in a state of riding on an air flow due to air supply in the air, and then the ferrite particles having average particle sizes of 1 to 2000 nm were captured and collected. The aforementioned capture can be performed, for example, by a method in which rapidly cooled and solidified ferrite particles are conveyed in a state of riding on the air flow due to air supply, ferrite particles having particle sizes exceeding the aforementioned range are allowed to drop in the midway of the air flow path, and the ferrite particles having the particle sizes falling within the aforementioned range are captured with a filter equipped on the downstream side of the air flow.

Subsequently, the collected ferrite particles are classified, if required, to be regulated to desired particle sizes. As the classification method, existing pneumatic classification, a mesh filtration method, a settling method and the like can be used. It is to be noted that by using a cyclone or the like, the particles having large particle sizes can also be removed.

In addition, the obtained ferrite particles preferably undergo a surface treatment with a coupling agent. By performing a surface treatment with a coupling agent, the dispersibility of the ferrite particles in a resin, a solvent, and a resin composition can be more improved. As the coupling agent, various silane coupling agents, titanate-based coupling agents, and aluminate-based coupling agents can be used, and more preferably decyltrimethoxysilane and n-octyltriethoxysilane can be used. The surface treatment amount depends on the BET specific surface area of the ferrite particles, but is preferably 0.05 to 2% by weight in relation to the ferrite particles in terms of the silane coupling agent.

<Applications of Ferrite Particles According to Present Invention>

The ferrite particles according to the present invention can be used for the resin films for flexible printed wiring boards. First, the ferrite particles are added as a filler to a resin composition containing an aqueous solvent or an organic solvent-based solvent, stirred and mixed, to disperse the ferrite particles in the resin composition. Subsequently, the obtained filler-containing resin composition is applied to a substrate, then the solvent is evaporated to harden the resin, and thus a resin film can be prepared.

The ferrite particles act as a magnetic filler in the resin film. The aforementioned ferrite particles have a high saturation magnetisation and a low residual magnetisation, accordingly, when a metal wiring is formed by laminating a metal layer on the resin film, the resin film being already unnecessary can be removed by adsorbing the unnecessary resin film by applying a magnetic field.

Moreover, the ferrite particles according to the present invention can be used in various applications, without being limited to the resin films for flexible printed wiring boards. The aforementioned ferrite particles may be used as a filler, in particular, as a magnetic filer, and may also be used as a raw material for a molded article. When the aforementioned ferrite particles are used as a raw material for a molded article, molding, granulation, coating and the like may be performed, and firing may also be performed.

Hereinafter, the present invention is specifically described by way of Examples and the like.

EXAMPLES

1. Preparation of Ferrite Particles

Example 1

Iron oxide ($Fe_2O_3$) and manganese oxide (MnO) were weighed in a molar ratio of 80:20, and were mixed. Water was added to the mixture, and the mixture was pulverized to prepare a slurry having a solid content of 50% by weight.

The prepared slurry was granulated with a spray dryer, and classified to prepare a granulated product having an average particle size of 5 μm.

Next, the obtained granulated product was ferritized by thermally spraying the obtained granulated product under the condition of a linear velocity of approximately 40 m/sec into a combustible gas combustion flame of propane:oxygen=10 Nm³/hr:35 Nm³/hr, and subsequently the ferritized product was conveyed in a state of riding on the air flow due to air supply, and thus rapidly cooled in the air. In this case, the granulated product was thermally sprayed while the granulated product was being allowed to continuously flow, and accordingly, the particles after thermal spraying-rapid cooling were not bonded to each other and were mutually independent. Subsequently, the cooled particles were captured with a filter equipped on the downstream side of the air flow. In this case, the particles having large particle sizes dropped in the midway of the air flow path, and were not captured with the filter. Next, the captured particles were classified to remove the coarse powder having particle sizes exceeding 2000 nm, and thus ferrite particles were obtained. In other words, the obtained ferrite particles had the maximum particle size of 2000 nm or less.

Example 2

In present Example, ferrite particles were prepared in the same manner as in Example 1 except that the molar ratio between iron oxide and manganese oxide was set to be 50:50.

Example 3

In present Example, ferrite particles were prepared in the same manner as in Example 1 except that the molar ratio between iron oxide and manganese oxide was set to be 90:10.

Example 4

In present Example, by using the ferrite particles of Example 1, ferrite particles which were surface-treated with a silane coupling agent were prepared.

First, an acetic acid aqueous solution containing decyltrimethoxysilane (KBM 3103C, Shin-Etsu Chemical Co., Ltd.) as a silane coupling agent was prepared. Subsequently, the ferrite particles of Example 1 were added to the obtained acetic acid aqueous solution so as for the solid content to be 10% by weight and stirred, and thus a slurry in which the ferrite particles were dispersed in the aforementioned acetic acid aqueous solution was prepared. Next, by adding an ammonia aqueous solution to the obtained slurry until the pH of the slurry became 8, the ferrite particles were surface-treated with the coupling agent. In this case, the surface treatment amount was 0.1% by weight in relation to the ferrite particles in terms of the silane coupling agent. Next, the slurry containing the surface-treated ferrite particles was heat treated at 180° C. for 6 hours to remove the water, and then pulverized by using a sample mill, to prepare ferrite particles which were surface-treated with the silane coupling agent.

Comparative Example 1

In present Comparative Example, a granulated product was obtained in the same manner as in Example 1, then the granulated product was placed in a saggar, and fired in an electric furnace at 1200° C., for 4 hours in a nitrogen atmosphere having an oxygen concentration of 0% by volume to ferritize the granulated product, and thus a fired product being an agglomerate adapted to the shape of the saggar was obtained. The obtained fired product was rapidly cooled in the air, the cooled fired product was ground in a mortar to be pulverized, and thus ferrite particles were obtained.

Comparative Example 2

In present Comparative Example, a granulated product was obtained in the same manner as in Example 1 except that a granulated product having an average particle size of 39 μm was prepared by changing the conditions of the spray dryer. The obtained granulated product was fired in the same manner as in Comparative Example 1, and the obtained fired product was rapidly cooled in the air. Then, the cooled fired product was de-agglomerated with a hammer mill, and thus ferrite particles were obtained.

Comparative Example 3

In present Comparative Example, ferrite particles were prepared in the same manner as in Example 1 except that the cooled particles were directly captured (all the particles were captured) without allowing the cooled particles to ride on the air flow.

Comparative Example 4

In present Comparative Example, ferrite particles were prepared in the same manner as in Example 1 except that the molar ratio between iron oxide and manganese oxide was set to be 40:60.

Comparative Example 5

In present Comparative Example, ferrite particles were prepared in the same manner as in Example 1 except that the molar ratio between iron oxide and manganese oxide was set to be 100:0.

2. Preparation of Ink for Forming Coating Film and Preparation of Resin Film

For the purpose of preparing the resin films containing as fillers the ferrite particles obtained in Examples 1 to 4 and Comparative Examples 1 to 5, first, inks for forming coating films as the resin compositions containing the aforementioned ferrite particles were prepared as follows.

(Preparation of Ink for Forming Coating Film (Using Aqueous Solvent))

For the ferrite particles of each of Examples 1 to 3 and Comparative Examples 1 to 5, ferrite particles were added to a polyimide vanish (solid content: 20% by weight) in which the solvent was composed of N-methyl-2-pyrrolidone and water, then stirred and mixed by using a stirrer, and thus an ink for forming a coating film was prepared. The addition amount of the ferrite particles was 30% by weight in relation to the polyimide.

(Preparation of Ink for Forming Coating Film (Using Organic Solvent-Based Solvent))

For the ferrite particles of Example 4, the ferrite particles were added to a polypropylene varnish (solid content: 25% by weight) in which the solvent was toluene, then stirred and mixed by using a stirrer, and thus an ink for forming a coating film was prepared. The addition amount of the ferrite particles was 30% by weight in relation to the polypropylene.

Next, by using the obtained ink for forming a coating film, a coating film was formed on a PET film or a glass plate as a substrate, with a Baker-type applicator (SA-201, Tester Sangyo Co., Ltd.). The thickness of the coating film was set at 4 mil (101.6 µm), and the width of the coating film was set at 10 cm. Subsequently, the solvent was dried and the resin was hardened, and thus a resin film was obtained.

3. Method for Evaluating Ferrite Particles

For the obtained ferrite particles of each of Examples 1 to 3 and Comparative Examples 1 to 5, a chemical analysis was performed, and the powder properties and magnetic properties (shape, crystal form, average particle size, BET specific surface area, saturation magnetisation, residual magnetisation, and carbon content) were evaluated. The chemical analysis, and the measurement methods of the BET specific surface area, the magnetic properties, the resistivity and the carbon content are as follows, and the other measurement methods are as described above. The results thus obtained are shown in Table 1. Moreover, the carbon content was measured for the obtained ferrite particles of Example 4. The result thus obtained is shown in Table 2.

(Chemical Analysis: Contents of Fe and Mn)

The contents of Fe and Mn in the ferrite particles were measured as follows. First, 0.2 g of the ferrite particles were weighed out, and placed in an acid aqueous solution prepared by adding 20 ml of 1N hydrochloric acid and 20 ml of 1N nitric acid to 60 ml of pure water; then the acid aqueous solution was heated to completely dissolve the ferrite particles to prepare a ferrite-containing solution. The obtained aqueous solution was set in an ICP analyzer (ICPS-1000IV, Shimadzu Corporation), and the contents of the metal components in the ferrite particles were measured.

(Shape)

The average degree of sphericity was measured by the above-described method. The case where the average degree of sphericity was 1.2 or less was determined to be a "spherical shape."

(Crystal Form)

The ferrite particles of Example 1 were observed on the basis of a transmission electron micrograph (magnification: 100,000), and the electron diffraction pattern was obtained from the obtained transmission electron micrograph. The results thus obtained are shown in FIG. 1 and FIG. 2.

(Average Particle Size)

For the ferrite particles of each of Examples 1 to 3, the average particle size was derived from the above-described horizontal Feret's diameters, and for the ferrite particles of each of Comparative Examples 1 to 5, the below-described volume average particle size was taken as the average particle size.

(Volume Average Particle Size (Microtrac))

The volume average particle size was measured by using the Microtrac Particle Size Distribution Analyzer (Model 9320-X100, Nikkiso Co., Ltd.). First, 10 g of the obtained ferrite particles were placed in a beaker together with 80 ml of water as a dispersion medium, and a few drops of sodium hexametaphosphate aqueous solution as a dispersant were added. Next, against the obtained solution, a supersonic homogenizer (UH-150, SMT Corporation) was made to oscillate at an output level of 4 for 20 seconds to disperse the ferrite particles in the solution. Next, the foam generated on the surface of the solution in the beaker was removed, then the solid-liquid separation was performed, and the ferrite particles were collected. For the collected ferrite particles, the volume average particle size was measured.

(BET Specific Surface Area)

The measurement of the BET specific surface area was performed by using a specific surface area meter (Macsorb HM model-1208, Mountek Inc.). First, approximately 10 g of the obtained ferrite particles were placed on a powder paper, and deaerated in a vacuum drier; the degree of vacuum was verified to be −0.1 MPa or less, and then the ferrite particles were heated at 200° C. for 2 hours to remove the moisture attaching to the surface of the ferrite particles. Subsequently, 0.5 to 4 g of the ferrite particles from which the moisture was removed were placed in the standard sample cell dedicated to the aforementioned apparatus, and then accurately weight with a precision balance. Subsequently, the weighed ferrite particles were set at the measurement port of the aforementioned apparatus and were measured. The measurement was performed according to a one-point method. The measurement atmosphere was such that the temperature was 10 to 30° C., and the relative humidity was 20 to 80% (free from dew condensation).

(Magnetic Properties)

The measurements of the magnetic properties were performed by using a vibrating sample type magnetometer (VSM-C7-10A, Toei Industry Co., Ltd.). First, the obtained ferrite particles were charged in a cell having an inner diameter of 5 mm and a height of 2 mm, and the cell was set in the aforementioned apparatus. In the aforementioned apparatus, a magnetic field was applied, and the magnetic field was swept up to 5 K·1000/4π·A/m. Next, the applied magnetic field was decreased and a hysteresis curve was depicted on a recording paper. In this curve, the magnetisation when the applied magnetic field was 5 K·1000/4π·A/m was taken as the saturation magnetisation, and the magnetisation when the applied magnetic field was 0 K·1000/4π·A/m was taken as the residual magnetisation.

(Carbon Content)

The measurement of the carbon content was performed by using a carbon analyzer (C-200, LECO Corporation). The oxygen gas pressure was set at 2.5 kg/cm$^2$, and the nitrogen gas pressure was set at 2.8 kg/cm$^2$. First, a measurement was performed by using the aforementioned apparatus for a standard sample having a known carbon content comparable with the carbon content of the ferrite particles. A measurement was performed without using the sample itself (blank test). Then, from the obtained measurement values, a conversion coefficient was calculated on the basis of the following formula:

Conversion coefficient=Weighed amount of standard sample (g)/[(measurement value of standard sample)−(measurement value in blank test)]× carbon content of standard sample (% by weight)/100

Subsequently, the measurement of the ferrite particles was performed with the aforementioned apparatus, and the carbon content was calculated on the basis of the following formula:

Carbon content (% by weight)=[(measurement value of ferrite particles)−(measurement value in blank test)]×conversion coefficient/weighed amount of ferrite particles (g)×100

TABLE 1

| | Initial molar ratio | | Production method | Chemical analysis (ICP) (% by weight) | | Shape | Powder properties/magnetic properties | | | | | |
|---|---|---|---|---|---|---|---|---|---|---|---|---|
| | | | | | | | Crystal form | Average particle size (μm) | BET specific surface area (m²/g) | Saturated magnetisation※1 (Am²/kg) | Residual magnetisation※2 (Am²/kg) | Carbon content (% by weight) |
| | Fe₂O₃ | MnO | | Fe | Mn | | | | | | | |
| Example 1 | 80 | 20 | Thermal spray | Capture with filter | 62.1 | 8.2 Sphere | Single crystal | 0.186 | 10.33 | 75.9 | 8.9 | <0.01 |
| Example 2 | 50 | 50 | Thermal spray | Capture with filter | 58.9 | 19.4 Sphere | Single crystal | 0.085 | 18.20 | 60.6 | 7.2 | 0.01 |
| Example 3 | 90 | 10 | Thermal spray | Capture with filter | 64.0 | 4.3 Sphere | Single crystal | 0.562 | 8.23 | 71.3 | 9.8 | <0.01 |
| Comparative Example 1 | 80 | 20 | Electric furnace | Pulverization | 63.1 | 8.0 Irregular | Poly-crystal | 5.564 | 0.56 | 85.6 | 20.0 | <0.01 |
| Comparative Example 2 | 80 | 20 | Electric furnace | De-agglomerated | 64.8 | 8.1 Granular | Poly-crystal | 37.84 | 0.08 | 92.3 | 3.2 | <0.01 |
| Comparative Example 3 | 80 | 20 | Thermal spray | Direct capture | 64.1 | 7.7 Sphere | Single crystal | 12.35 | 0.34 | 78.1 | 3.0 | <0.01 |
| Comparative Example 4 | 40 | 60 | Thermal spray | Capture with filter | 57.9 | 23.3 Sphere | Single crystal | 0.072 | 12.30 | 42.3 | 9.2 | 0.01 |
| Comparative Example 5 | 100 | 0 | Thermal spray | Capture with filter | 65.9 | 0.3 Sphere | Single crystal | 0.895 | 15.05 | 64.1 | 12.1 | 0.01 |

※1 Magnetisation at 5K · 1000/4π · A/m
※2 Magnetisation at 0K · 1000/4π · A/m

TABLE 2

| | Surface treatment (Silane coupling agent) | | | |
|---|---|---|---|---|
| | Surface treatment agent | Treatment amount※4 (% by weight) | Heat treatment condition | Carbon content (% by weight) |
| Example 4 | Decyltrimethoxysilane ※3 | 0.1 | 180° C. × 6 hr | 0.05 |

※3: Trade name: KBM 3103C (Shin-Etsu Chemical Co., Ltd.)
※4 Amount of silane coupling agent in relation to ferrite particles 4. Methods for Evaluating Ink for Forming Coating Film and Resin Film The inks for forming a coating film using the ferrite particles obtained in Examples 1 to 4 and Comparative Examples 1 to 5, and the resin films formed by using the aforementioned inks for forming a coating film were evaluated as follows. The results thus obtained are shown in Table 3.

(Dispersibility)

For each of the inks for forming a coating film using the ferrite particles obtained in Examples 1 to 4 and Comparative Examples 1 to 5, the dispersibility of the ferrite particles in the resin composition was evaluated from the time required until the ferrite particles were uniformly dispersed during stirring. The symbols in Table 3 are as follows. It is to be noted that the determination of whether or not the uniform dispersion was achieved was performed by visual observation.

○: The stirring time required until uniform dispersion was achieved was less than 5 minutes.
Δ: The stirring time required until uniform dispersion was achieved was 5 minutes or more and less than 30 minutes.
x: The stirring time required until uniform dispersion was achieved was 30 minutes or more.

(Surface Smoothness)

The film thickness of each of the resin films formed by using the aforementioned inks for forming a coating film was measured by using a micrometer. The measurement was performed for nine different positions. Then, the difference between the maximum film thickness and the minimum film thickness (maximum film thickness–minimum film thickness) was calculated, and the surface smoothness of the resin film was evaluated from the difference. The symbols in Table 3 are as follows.

○: Maximum film thickness–minimum film thickness=10 μm or less.
Δ: Maximum film thickness–minimum film thickness=10 to 20 μm.
x: Maximum film thickness–minimum film thickness=20 μm or more.

(Magnetic Adsorption Performance)

For each of the aforementioned resin films, the magnetic adsorption performance was evaluated by measuring the saturation magnetisation. The measurement was performed by using the above-described vibrating sample type magnetometer in the same manner as in the above-described measurement of the saturation magnetisation of the ferrite particles except that in place of the ferrite particles, 100 mg of a magnetic film cut into 1-mm squares was filled in the cell, and the magnetic field was swept up to 10 K·1000/4π·A/m. From the measurement value of the saturation magnetisation, the magnetic adsorption performance of the resin film was evaluated. The symbols in Table 3 are as follows.

○: 10.0 Am²/kg or more.
Δ: 5.0 to 10.0 Am²/kg.
x: Less than 5.0 Am²/kg.

TABLE 3

| | Ink for forming coating film | | | Resin film | |
|---|---|---|---|---|---|
| | Resin | Dispersibility | Substrate | Surface smoothness | Magnetic adsorption performance |
| Example 1 | Polyimide | ○ | PET film | ○ | ○ |
| Example 2 | Polyimide | ○ | PET film | ○ | ○ |
| Example 3 | Polyimide | ○ | PET film | ○ | ○ |

TABLE 3-continued

| | Ink for forming coating film | | | Resin film | |
|---|---|---|---|---|---|
| | Resin | Dispersibility | Substrate | Surface smoothness | Magnetic adsorption performance |
| Example 4 | Polypropylene | ○ | Glass plate | ○ | ○ |
| Comparative Example 1 | Polyimide | X | PET film | X | ○ |
| Comparative Example 2 | Polyimide | X | PET film | Unevaluable | Unevaluable |
| Comparative Example 3 | Polyimide | Δ | PET film | X | ○ |
| Comparative Example 4 | Polyimide | ○ | PET film | ○ | X |
| Comparative Example 5 | Polyimide | X | PET film | Δ | ○ |

5. Evaluation Results of Ferrite Particles

FIG. 2 shows that the electron diffraction pattern is spot-like. Therefore, it is apparent that the ferrite particles of Example 1 are single crystalline body.

In addition, as shown in Table 1, the ferrite particles of each of Examples 1 to 3 were a single crystalline body having an average particle size of 1 to 2000 nm, and had a spherical particle shape. The ferrite particles of each of Examples 1 to 3 were Mn-based ferrite particles in which the metal component was composed of Mn and Fe, the content of Mn was within a range from 1 to 23% by weight, and the content of Fe was 58 to 65% by weight. It is to be noted that the metal components other than Mn and Fe were undetectable. The ferrite particles of each of Examples 1 to 3 had a saturation magnetisation within a range from 45 to 95 $Am^2/kg$, and a residual magnetisation within a range from 0 to 12 $Am^2/kg$. Therefore, it is apparent that the ferrite particles of each of Examples 1 to 3 compatibly had a high saturation magnetisation and a low residual magnetisation.

On the other hand, the ferrite particles of each of Comparative Examples 1 and 2 had the content of Mn within a range from 1 to 23% by weight and the content of Fe within a range from 58 to 65% by weight, in the same manner as in Examples 1 to 3. However, the ferrite particles of each of Comparative Examples 1 and 2 were composed of a polycrystalline substance having an average particle size larger than 2000 nm, and had an irregular or granular particle shape.

The ferrite particles of Comparative Example 3 were Mn-based ferrite particles being single crystalline body, having spherical particle shapes, and having the contents of Mn within a range from 1 to 23% by weight, in the same manner as in Examples 1 to 3. The ferrite particles of Comparative Example 3 had a saturation magnetisation within a range from 45 to 95 $Am^2/kg$, and a residual magnetisation within a range from 0 to 12 $Am^2/kg$, in the same manner as in Examples 1 to 3. However, the ferrite particles of Comparative Example 3 had an average particle size larger than 2000 nm.

The ferrite particles of Comparative Example 4 were single crystalline body having average particle sizes of 1 to 2000 nm and had spherical shapes, in the same manner as in Examples 1 to 3, but had a Mn content of 23.3% by weight. The ferrite particles of Comparative Example 4 had a saturation magnetisation less than 45 $Am^2/kg$, and were lower in saturation magnetisation than the saturation magnetisations in Examples 1 to 3.

The ferrite particles of Comparative Example 5 were single crystalline body having average particle sizes of 1 to 2000 nm, and had spherical shapes, in the same manner as in Examples 1 to 3. The ferrite particles of Comparative Example 5 had a content of Mn of 0.3% by weight, but this is ascribable to the inevitable impurity contained in the raw material iron oxide ($Fe_2O_3$). Therefore, it is conceivable that the ferrite particles of Comparative Example 5 are substantially not Mn-based ferrite particles. The ferrite particles of Comparative Example 5 had a saturation magnetisation within a range from 45 to 95 $Am^2/kg$, but had a residual magnetisation larger than 12 $Am^2/kg$, to be higher than the residual magnetisations in Examples 1 to 3.

In other words, the ferrite particles of each of Comparative Examples 4 and 5 were composed of a single crystalline body having an average particle size of 2000 nm or less, and had a spherical shape, in the same manner as in Examples 1 to 3, but were not able to have both a high saturation magnetisation and a low residual magnetisation.

As shown in Table 2, it is apparent that the ferrite particles of Example 4 which were surface treated with a silane coupling agent was increased in the carbon content as compared with the ferrite particles of Example 1 which were not surface treated. However, because the carbon content was as small as 0.05% by weight in the ferrite particles of Example 4, it is conceivable that the surface treatment with a silane coupling agent is restricted to a very thin surface region of the ferrite particles, and the resistivity of the ferrite particles is not changed between before and after the surface treatment. Therefore, it is conceivable that the magnetic properties (saturation magnetisation and residual magnetisation) are not changed between before and after the surface treatment, and the ferrite particles of Example 4 have the same magnetic properties as the magnetic properties of the ferrite particles of Example 1.

6. Evaluation Results of Ink for Forming Coating Film and Resin Film

As shown in Table 3, the ferrite particles of Examples 1 to 4 were all excellent in the dispersibility in the resin composition. Therefore, it is conceivable that the ferrite particles of Examples 1 to 4 can secure excellent productivity when resin films are produced. In particular, the ferrite particles of Example 4 which were surface treated with a silane coupling agent were excellent in the dispersibility in the resin composition although the solvent in the resin composition was an organic solvent-based solvent (non-aqueous solvent). The resin films of Examples 1 to 4 were small in the surface asperities of the resin films and excellent in the surface smoothness, and large in the saturation magnetisation and good in the magnetic adsorption performance.

On the other hand, the ferrite particles of Comparative Example 1 were low in the dispersibility in the resin composition, and took a long time until being dispersed. Therefore, it is conceivable that the ferrite particles of Comparative Example 1 are low in the productivity in the production of resin films. The resin film of Comparative Example 1 was large in the surface asperities of the film and poor in the surface smoothness. This is probably because the ferrite particles of Comparative Example 1 have an average particle size of approximately 5.6 μm to be larger than the average particle sizes in Examples 1 to 3, are irregular in shape and tend to be mutually aggregated due to a large residual magnetisation.

The ferrite particles of Comparative Example 2 were low in the dispersibility in the resin composition, and took a long time until being dispersed. Therefore, it is conceivable that the ferrite particles of Comparative Example 2 are low in the productivity in the production of resin films. In addition, because the ferrite particle had a large average particle size of 37 µm and were granular, no resin film was able to be formed, and the film thickness and the saturation magnetisation of the resin film were not able to be measured.

The ferrite particles of Comparative Example 3 were lower in the dispersibility in the resin composition as compared with the ferrite particles of each of Examples 1 to 3. The resin film of Comparative Example 3 was large in the surface asperities of the film and poor in the surface smoothness. This is probably because the ferrite particles of Comparative Example 3 have an average particle size of approximately 12 µm to be larger than the average particle sizes in Examples 1 to 3.

The ferrite particles of Comparative Example 4 were excellent in the dispersibility in the resin composition, in the same manner as in Examples 1 to 3. The resin film of Comparative Example 4 was small in the surface asperities of the film and excellent in the surface smoothness, in the same manner as in Examples 1 to 3. However, the resin film of Comparative Example 4 was small in the saturation magnetisation and low in the magnetic adsorption performance. This is probably because the ferrite particles of Comparative Example 4 were small in the saturation magnetisation.

The ferrite particles of Comparative Example 5 were low in the dispersibility in the resin composition, and took a long time until being dispersed. Therefore, it is conceivable that the ferrite particles of Comparative Example 5 are low in the productivity in the production of resin films. The resin film of Comparative Example 5 was not able to obtain a sufficient surface smoothness. This is probably because the ferrite particles of Comparative Example 5 are large in the residual magnetisation, and accordingly tend to be mutually aggregated.

It is apparent from what has been described above that the ferrite particles being a single crystalline body having an average particle size of 1 to 2000 nm, being Mn-based ferrite particles having spherical shapes, and having a saturation magnetisation of 45 to 95 Am$^2$/kg have a high saturation magnetisation and a low residual magnetisation in a compatible manner, and are also high in the dispersibility in the resin composition. In addition, it is apparent that when a resin film is formed, the Mn-based ferrite particles provide an excellent surface smoothness and an excellent magnetic adsorption performance in a compatible manner. Examples presented above show that the dispersibility of the Mn-based ferrite particles in the resin composition is high, and it is conceivable that the Mn-based ferrite particles also exhibit excellent dispersibility in resins or solvents.

INDUSTRIAL APPLICABILITY

The ferrite particles according to the present invention can achieve a high saturation magnetisation, and can achieve an excellent dispersibility in a resin, a solvent or a resin composition. Therefore, when a resin composition containing the aforementioned ferrite particles as a filler is prepared and a molded article such as a resin film composed of the aforementioned resin composition is formed, the aforementioned ferrite particles prevent the aggregation of the ferrite particles on the surface of the molded article, allows the molded article to obtain a smooth surface, and allows the molded article to be adsorbed by applying a magnetic field to the molded article. In addition, by using a resin composition containing the ferrite articles as a filler or the resin film composed of the aforementioned resin composition as a flexible printed wiring board used for wirings to electronic devices, cables and the like, the resin composition or the resin film coming to be unnecessary in the step of forming a metal wiring can be adsorbed and removed by applying a magnetic field, and hence a metal wiring can be simply and efficiently formed. Moreover, the ferrite particles according to the present invention can be suitably used as a raw material for a magnetic filler or a raw material for a molded article.

The invention claimed is:

1. Ferrite particles, wherein the ferrite particles are composed of a single crystalline body having an average particle size of 1 to 2000 nm, are Mn-based ferrite particles having a spherical particle shape, and have a saturation magnetisation of 45 to 95 Am$^2$/kg;
    wherein the metal component is composed of Mn and Fe, and contains Mn in a content of 1 to 23% by weight, and Fe in a content of 58 to 65% by weight.

2. The ferrite particles according to claim 1, wherein the residual magnetisation is 0 to 12 Am$^2$/kg.

3. The ferrite particles according to claim 1, wherein the BET specific surface area is 1 to 30 m$^2$/g.

4. A resin composition comprising as a filler the ferrite particles according to claim 1.

5. A resin film comprising the resin composition according to claim 4.

\* \* \* \* \*